(12) United States Patent
Kamibaba et al.

(10) Patent No.: US 11,094,691 B2
(45) Date of Patent: Aug. 17, 2021

(54) SEMICONDUCTOR DEVICE

(71) Applicant: Mitsubishi Electric Corporation, Tokyo (JP)

(72) Inventors: Ryu Kamibaba, Tokyo (JP); Tetsuo Takahashi, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 52 days.

(21) Appl. No.: 16/736,463

(22) Filed: Jan. 7, 2020

(65) Prior Publication Data

US 2020/0287028 A1 Sep. 10, 2020

(30) Foreign Application Priority Data

Mar. 7, 2019 (JP) .............................. JP2019-041642

(51) Int. Cl.
*H01L 27/07* (2006.01)
*H01L 29/739* (2006.01)
*H01L 29/861* (2006.01)
*H01L 29/78* (2006.01)

(52) U.S. Cl.
CPC ...... *H01L 27/0716* (2013.01); *H01L 29/7397* (2013.01); *H01L 29/7804* (2013.01); *H01L 29/861* (2013.01)

(58) Field of Classification Search
CPC ............. H01L 27/0716; H01L 29/7397; H01L 29/861; H01L 29/66333; H01L 29/66348; H01L 29/7395; H01L 29/7802; H01L 29/66734; H01L 29/66136; H01L 21/823487
See application file for complete search history.

(56) References Cited

U.S. PATENT DOCUMENTS

| | | | | |
|---|---|---|---|---|
| 2014/0299914 | A1* | 10/2014 | Yilmaz | H01L 29/66348 257/139 |
| 2016/0111419 | A1* | 4/2016 | Naito | H01L 29/404 257/140 |
| 2016/0343803 | A1* | 11/2016 | Aketa | H01L 29/6606 |
| 2017/0302182 | A1* | 10/2017 | Shimizu | H02M 3/158 |

FOREIGN PATENT DOCUMENTS

| | | |
|---|---|---|
| JP | 2006344779 A | 12/2006 |
| JP | 2016225583 A | 12/2016 |

* cited by examiner

*Primary Examiner* — Joseph C. Nicely
(74) *Attorney, Agent, or Firm* — Studebaker & Brackett PC

(57) ABSTRACT

A semiconductor device includes a semiconductor substrate, and the semiconductor substrate is divided into an IGBT region, a diode region, and a MOSFET region. A drift layer of $n^-$-type is provided in the semiconductor substrate. The drift layer is shared among the IGBT region, the diode region, and the MOSFET region. In the semiconductor substrate, the diode region is always disposed between the IGBT region and the MOSFET region to cause the IGBT region and the MOSFET region to be separated from each other without being adjacent to each other.

12 Claims, 8 Drawing Sheets

SEMICONDUCTOR DEVICE

BACKGROUND OF THE INVENTION

Field of the Invention

The present invention relates to a semiconductor device including an IGBT region, a diode region, and a MOSFET region.

Description of the Background Art

Most of the inverter devices used in a wide range of fields such as home appliances, electric vehicles, and trains drive inductive loads such as induction motors. Such an inverter device includes various types of semiconductor devices including a switching element such as an insulated gate bipolar transistor (IGBT) or a metal-oxide-semiconductor field-effect transistor (MOSFET), and a freewheeling diode (hereinafter, sometimes simply referred to as a "diode"). Since the inverter device is required to have high efficiency and low power consumption, there is a demand from the market for semiconductor devices having higher performance and manufactured at lower cost.

In order to increase performance of and reduce cost of power semiconductor devices, a trench MOS gate structure, a thinner semiconductor substrate, a reverse conducting IGBT (RC-IGBT), and the like have been under development. The RC-IGBT is a semiconductor device that allows bidirectional conduction. For example, such an RC-IGBT includes an IGBT and a diode that are incorporated into a single semiconductor substrate.

Japanese Patent Application Laid-Open No. 2016-225583 discloses a semiconductor device including a semiconductor substrate, an SJ-MOSFET portion including at least two super-junction transistor regions provided on the semiconductor substrate, at least one IGBT region interposed between the at least two super-junction transistor regions in a vertical cross sectional view of the semiconductor substrate, and a freewheeling diode portion at a boundary between an IGBT portion including the IGBT region and the SJ-MOSFET portion including the super-junction transistor regions.

As with the conventional semiconductor device disclosed in Japanese Patent Application Laid-Open No. 2016-225583, the RC-IGBT including an SJ-MOSFET has a structure where a p-type column and an n-type column are alternately arranged in the SJ-MOSFET portion.

The above structure brings about, when a reverse voltage is applied, high electric field concentration at a p-n boundary between the IGBT and the SJ-MOSFET. This causes, in the conventional semiconductor device, hole carriers to flow from the p-type column in the MOSFET region toward the diode region during reverse conduction in which diode operation is performed in the freewheeling diode portion.

This in turn increases, in the conventional semiconductor device, a recovery current due to the inflow of the hole carriers as described above, which results in poor electrical characteristics.

Furthermore, it is necessary to manufacture the p-type column and the n-type column by epitaxial growth, which increases manufacturing cost.

SUMMARY

It is therefore an object of the present invention to provide a semiconductor device having excellent electrical characteristics and manufactured at lower cost.

A semiconductor device according to the present invention includes an IGBT region having an IGBT therein, a diode region having a diode therein, and a MOSFET region having a MOSFET therein.

The semiconductor device includes a semiconductor substrate, a drift layer of a first conductivity type, a base layer of a second conductivity type, and an anode layer of the second conductivity type.

The semiconductor substrate includes first and second main surfaces, and the drift layer is provided in the semiconductor substrate.

The base layer is provided in the semiconductor substrate and is selectively disposed adjacent to the first main surface side relative to the drift layer.

The anode layer is provided in the semiconductor substrate and is selectively disposed adjacent to the first main surface side relative to the drift layer.

The drift layer is shared among the IGBT region, the diode region, and the MOSFET region, the base layer is shared between the IGBT region and the MOSFET region, and the anode layer is used in the diode region.

The IGBT region and the MOSFET region each includes a buried conductive layer buried in a region extending from the first main surface into the drift layer through the base layer with an insulating film interposed between the buried conductive layer and the base layer and the drift layer.

The IGBT region and the MOSFET region each includes a MOS gate structure where the buried conductive layer serves as a gate electrode, the insulating film serves as a gate insulating film, and the base layer serves as a channel region.

The diode region is disposed between the IGBT region and the MOSFET region to cause the IGBT region and the MOSFET region to be separated from each other without being adjacent to each other.

Since the semiconductor device according to the present invention includes the MOSFET region having the MOSFET in addition to the IGBT region having the IGBT, it is possible to reduce an on-state voltage in a range from the low-current range to the high-current range.

In the semiconductor device according to the present invention, the IGBT region and the MOSFET region are separated from each other without being adjacent to each other, which prevents IGBT operation made by an IGBT structure and MOSFET operation made by the MOSFET from interfering with each other.

As a result, the semiconductor device according to the present invention can perform both the IGBT operation and the MOSFET operation with high accuracy, and thus exhibits excellent electrical characteristics.

Further, since the drift layer is shared among the IGBT region, the diode region, and the MOSFET region, the manufacturing process is made easier, and thus the manufacturing cost can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Figure 1:
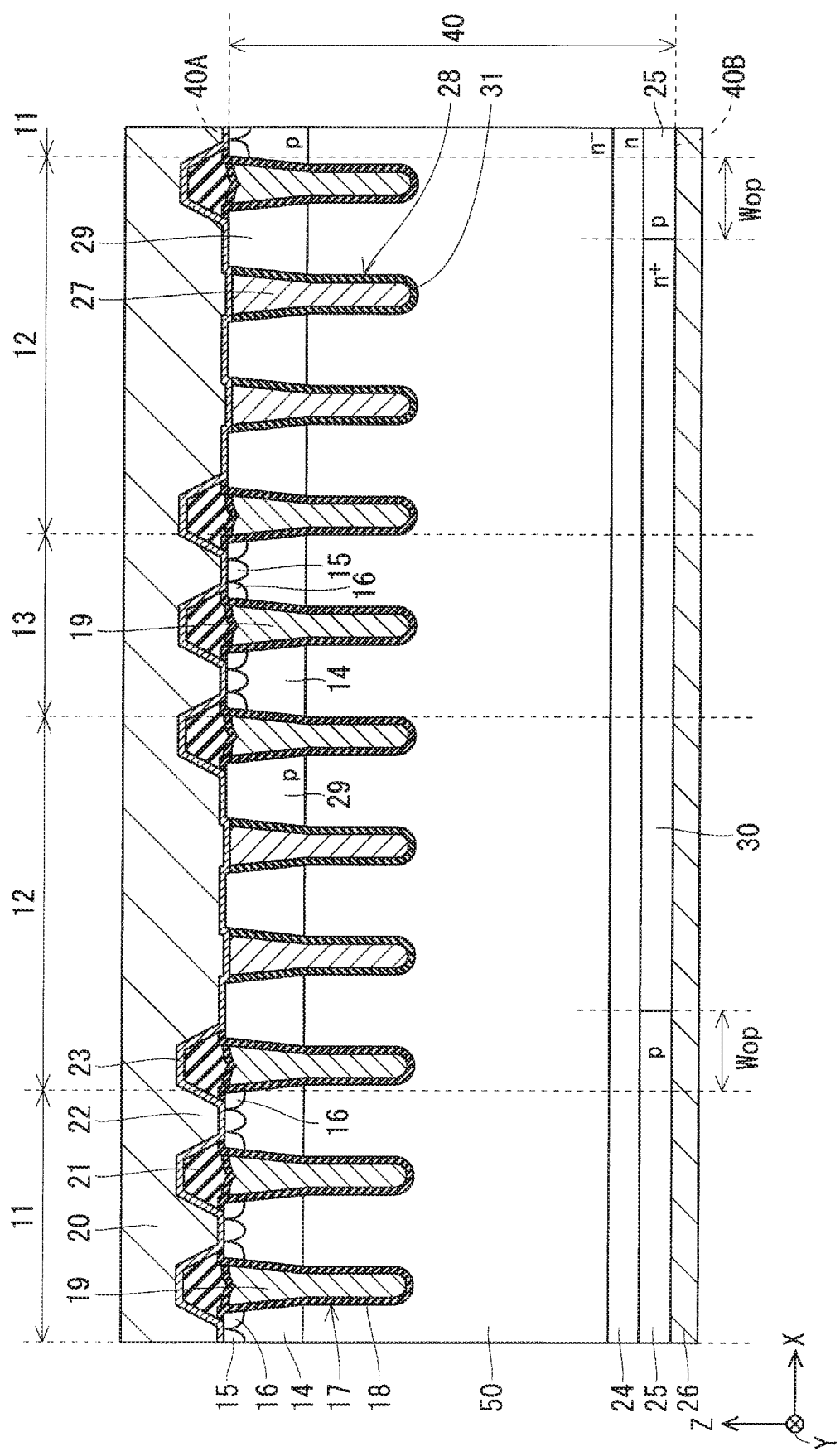
FIG. 1 is a cross-sectional view of a structure of a semiconductor device of a first preferred embodiment.

First to fifth preferred embodiments will be described below with reference to the drawings. The drawings are schematic illustrations, and dimensional and positional interrelationships may be changed. In the following description, the same or corresponding components may be given the same reference numerals, and the same description may be omitted. In the following description, terms that mean specific positions and directions, such as "up", "down", "side", "bottom", "front" or "back" may be used. However, these terms are used for convenience in order to facilitate understanding of the contents of the preferred embodiments, and do not limit directions when the present invention is actually implemented. In the following description, on a semiconductor conductivity type, a first conductivity type denotes an n-type, and a second conductivity type denotes a p-type. Note that, in contrast, the first conductivity type may denote the p-type, and the second conductivity type may denote the n-type. An $n^+$-type is higher in donor impurity concentration than the n-type, and an $n^-$-type is lower in donor impurity concentration than the n-type. Similarly, a $p^+$-type is higher in acceptor impurity concentration than the p-type, and a $p^-$-type is lower in acceptor impurity concentration than the p-type.

The term "MOS" has been used for a laminated structure of metal/oxide/semiconductor for long ago, and is an acronym standing for Metal-Oxide-Semiconductor. However, in particular, for a field effect transistor having a MOS structure (hereinafter, simply referred to as "MOSFET"), materials of a gate insulating film and a gate electrode have been improved from the viewpoint of recent integration and improvement in manufacturing process.

For example, for the MOSFET, polycrystalline silicon has been used instead of metal as a material of a gate electrode mainly from the viewpoint of forming a source and a drain in a self-aligned manner. From the viewpoint of improving electrical characteristics, a material having a high permittivity is used as a material of the gate insulating film, but the material is not necessarily limited to an oxide.

Therefore, the term "MOS" is not necessarily limited to the laminated structure of metal/oxide/semiconductor, and such limitation is not used as a premise herein. That is, in view of the common general technical knowledge, "MOS" represents not only an abbreviation derived from word origins, but also a laminated structure of conductor/insulator/semiconductor in a broad manner.

First Preferred Embodiment

FIG. 1 is a cross-sectional view of a structure of a semiconductor device 10 according to a first preferred embodiment. The semiconductor device 10 of the first preferred embodiment is an RC-IGBT. An XYZ orthogonal coordinate system is applied to FIG. 1. The XYZ orthogonal coordinate system is also applied to FIG. 2 to FIG. 8 to be described later.

The semiconductor device 10 includes a semiconductor substrate 40. The semiconductor substrate 40 has a front surface 40A serving as a first main surface on a +Z direction side and a back surface 40B serving as a second main surface in a −Z direction side that is on the opposite side of the semiconductor substrate 40 from the first main surface. Further, the semiconductor substrate 40 is divided into an IGBT region 11, a diode region 12, and a MOSFET region 13.

The semiconductor substrate 40 is provided with a drift layer 50 of $n^-$-type that is a first conductivity type, a base layer 14 of p-type that is a second conductivity type, and an anode layer 29 of p-type.

The base layer 14 is formed on an upper surface of the drift layer 50 in the IGBT region 11 and the MOSFET region 13. That is, the base layer 14 is selectively disposed, in the IGBT region 11 and the MOSFET region 13, adjacent to the front surface 40A side of the semiconductor substrate 40 relative to the drift layer 50.

The anode layer 29 is formed on the upper surface of the drift layer 50 in the diode region 12. That is, the anode layer 29 is selectively disposed, in the diode region 12, adjacent to the front surface 40A side of the semiconductor substrate 40 relative to the drift layer 50. Upper surfaces of the base layer 14 and the anode layer 29 on the +Z direction side serve as the front surface 40A of the semiconductor substrate 40. Therefore, the base layer 14 and the anode layer 29 are provided in the same formation layer in the semiconductor substrate 40.

The IGBT region 11 extends from the front surface 40A to the back surface 40B of the semiconductor substrate 40. The diode region 12 also extends from the front surface 40A to the back surface 40B of the semiconductor substrate 40. The IGBT region 11 and the diode region 12 are arranged adjacent to each other.

The MOSFET region 13 extends from the front surface 40A to the back surface 40B of the semiconductor substrate 40. The IGBT region 11 and the MOSFET region 13 are not adjacent to each other, and the diode region 12 and the MOSFET region 13 are arranged adjacent to each other.

That is, in the semiconductor substrate 40 of the first preferred embodiment, the diode region 12 is always disposed between the IGBT region 11 and the MOSFET region 13 to cause the IGBT region 11 and the MOSFET region 13 to be separated from each other without being adjacent to each other.

Figure 2:
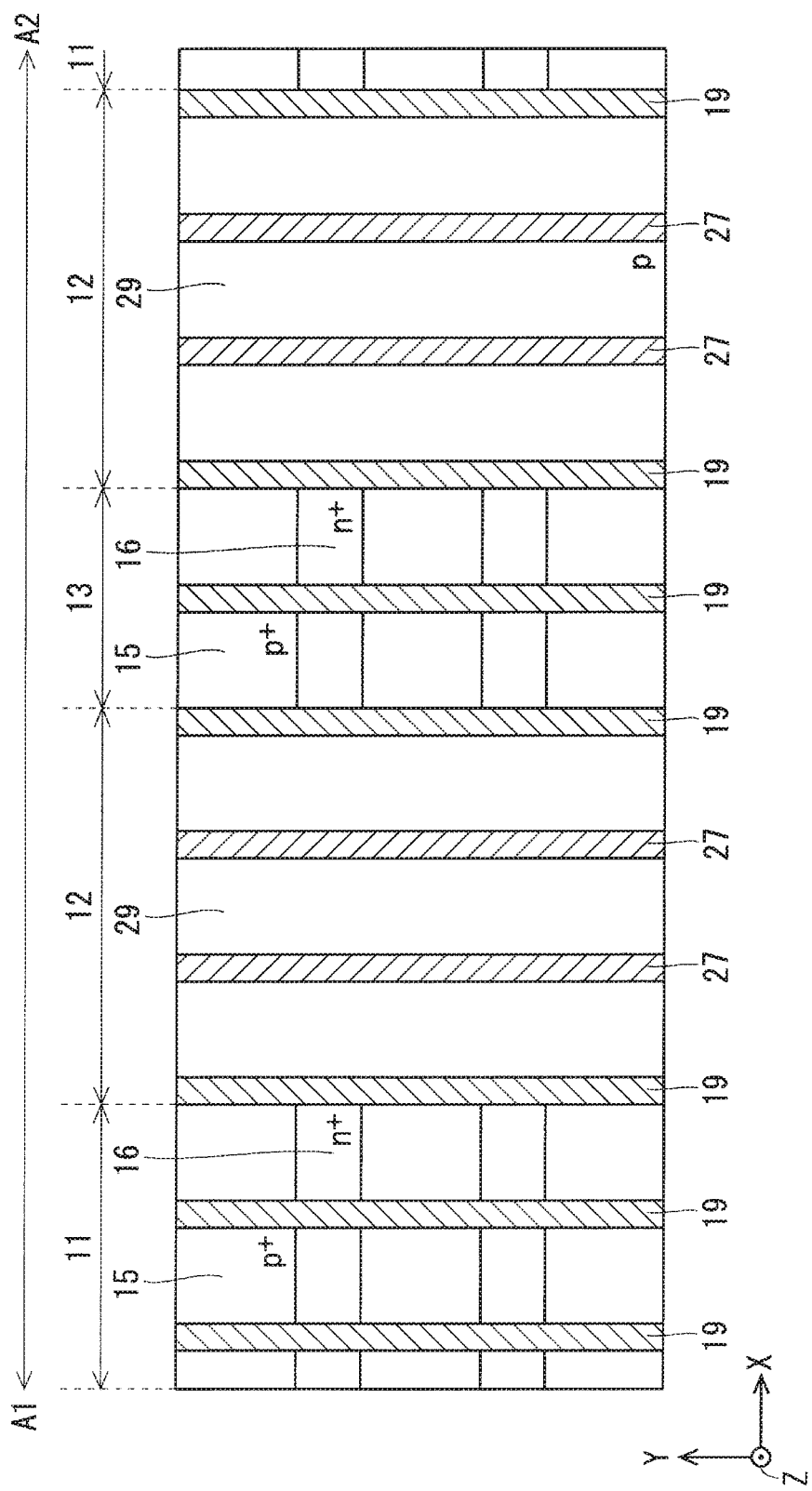
FIG. 2 is a plan view of the semiconductor device of the first preferred embodiment, as viewed from a front surface side of the semiconductor device.

FIG. 2 is a plan view showing a diffusion layer and a trench pattern of the semiconductor device 10, as viewed from the front surface 40A side. In the IGBT region 11 and the MOSFET region 13, an emitter layer 16 of $n^+$-type, a diffusion layer 15 of $p^+$-type, and a gate electrode 19 are present.

As shown in FIG. 1, in the IGBT region 11, a real trench 17 is provided in a region extending from the front surface 40A of the semiconductor substrate 40 into the drift layer 50 through the base layer 14. A buried conductive layer buried in the real trench 17 with an insulating film 18 interposed between the buried conductive layer and the base layer 14 and the drift layer 50 serves as the gate electrode 19.

As shown in FIG. 2, a plurality of the emitter layers 16 and a plurality of the diffusion layers 15 are provided like islands. A plurality of the gate electrodes 19 are provided extending linearly in plan view.

As shown in FIG. 2, in the diode region 12, the anode layer 29 of p-type and a dummy gate electrode 27 are provided. As shown in FIG. 1, in the diode region 12, a dummy trench 28 is provided in a region extending from the front surface 40A of the semiconductor substrate 40 into the drift layer 50 through the base layer 14, as with the real trench 17. A dummy buried conductive layer buried in the dummy trench 28 with an insulating film 31 interposed between the dummy buried conductive layer and the base layer 14 and the drift layer 50 serves as the dummy gate electrode 27.

As shown in FIG. 2, a plurality of the dummy gate electrodes 27 are provided extending linearly in plan view. FIG. 1 shows a cross-sectional structure in a direction from A1 to A2 of FIG. 2. Note that, for convenience of explanation, both the diffusion layer 15 and the emitter layer 16 are shown in FIG. 1 in order to make a boundary between the diffusion layer 15 and the emitter layer 16 clear.

Further, the structure of the MOSFET region 13 as viewed from the front surface 40A side is the same as the structure of the IGBT region 11.

Figure 3:
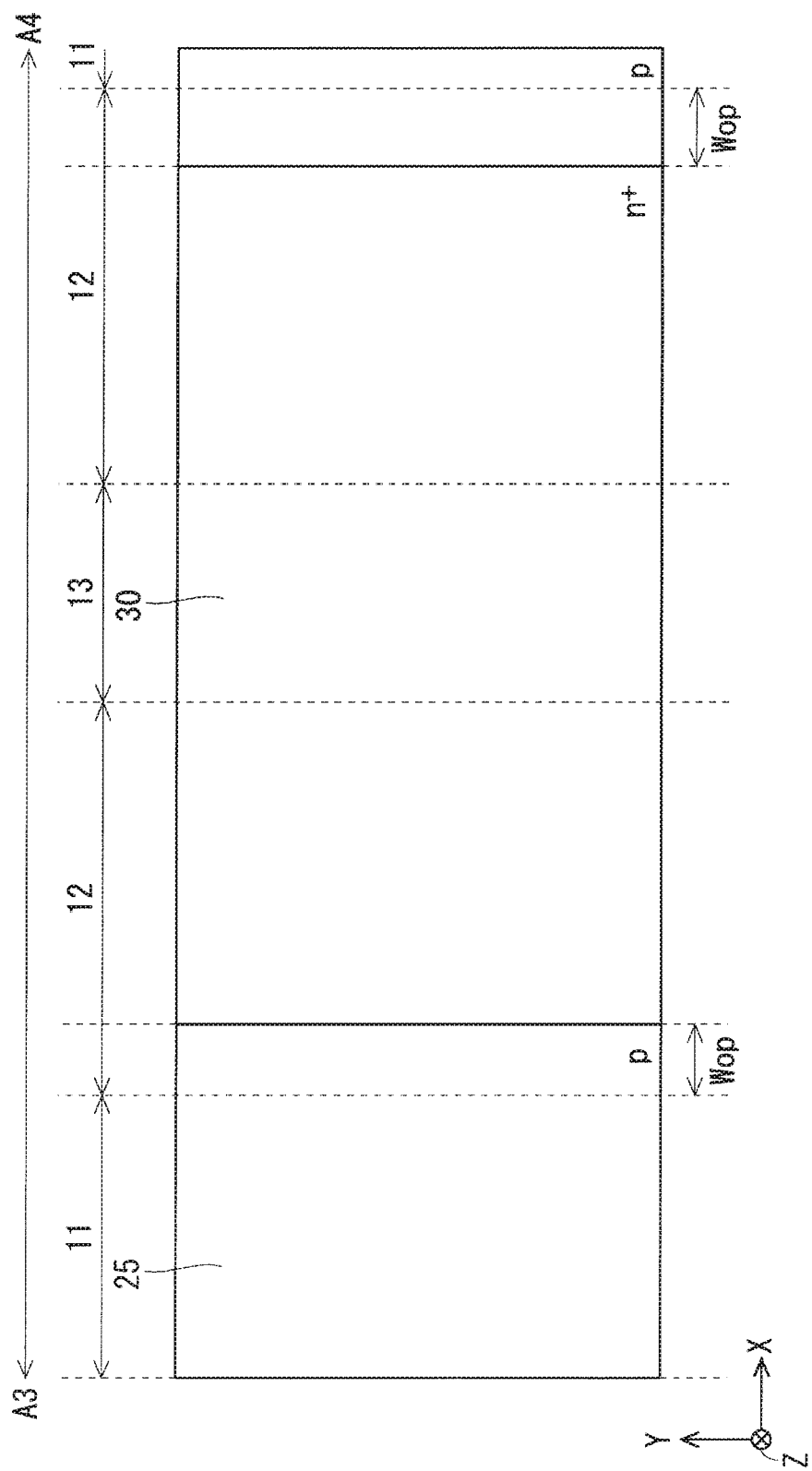
FIG. 3 is a plan view of the semiconductor device of the first preferred embodiment, as viewed from a back surface side of the semiconductor device.

FIG. 3 is a plan view showing a planar structure of the semiconductor device 10, as viewed from the back surface 40B side of the semiconductor substrate 40. FIG. 1 shows a cross-sectional structure in a direction from A3 to A4 of FIG. 3. A collector layer 25 of p-type is provided in the IGBT region 11 and part of the diode region 12, and a cathode layer 30 of $n^+$-type is provided in the diode region 12 and the MOSFET region 13. Lower surfaces of the collector layer 25 and the cathode layer 30 on the −Z direction side serve as the back surface 40B of the semiconductor substrate 40. The collector layer 25 and the cathode layer 30 are provided in the same formation layer in the semiconductor substrate 40.

A description will be given below of a structure of the IGBT region 11 and a basic operation of the IGBT with reference to FIG. 1 to FIG. 3. As shown in FIG. 1 and FIG. 2, in the IGBT region 11, the diffusion layer 15 of $p^+$-type and the emitter layer 16 of n-type are selectively provided in an upper portion of the base layer 14.

Further, as described above, the drift layer 50 of $n^-$-type, the base layer 14 of p-type, and the real trench 17 are provided in the IGBT region 11. As shown in FIG. 1, the base layer 14 is provided on the upper surface of the drift layer 50 of $n^-$-type on the +Z direction side. That is, the base layer 14 of p-type is disposed on a side of the drift layer 50 adjacent to the front surface 40A.

As described above, the diffusion layer 15 of $p^+$-type or the emitter layer 16 of $n^+$-type is selectively formed in the upper portion of the base layer 14. As shown in FIG. 2, the emitter layers 16 of $n^+$-type are formed to cause the diffusion layer 15 of $p^+$-type to be interposed between the emitter layers 16 in plan view.

The real trench 17 is provided in a region extending into the drift layer 50 through the base layer 14. In the real trench 17, as shown in FIG. 1, the gate electrode 19 is buried with the insulating film 18 interposed between the gate electrode 19 and the base layer 14 and the drift layer 50.

The gate electrode 19 may be made of a conductive material such as polysilicon. The gate electrode 19 faces the base layer 14 with the insulating film 18 interposed between the gate electrode 19 and the base layer 14 in the X direction. Examples of a material of the insulating film 18 may include $SiO_2$ that is silicon oxide.

As shown in FIG. 2, the real trench 17 extends into the drift layer 50 through the emitter layer 16 and the base layer 14 in a region where the emitter layer 16 of $n^+$-type is formed in plan view. On the other hand, the real trench 17 extends into the drift layer 50 through the diffusion layer 15 and the base layer 14 in a region where the diffusion layer 15 of $p^+$-type is formed in plan view.

In the IGBT region 11, as a surface structure formed on the surfaces of the diffusion layer 15, the emitter layer 16, and the gate electrode 19, for example, an emitter electrode 20, an interlayer insulating film 21, and a barrier metal film 23 shown in FIG. 1 are formed.

As shown in FIG. 1, the interlayer insulating film 21 is formed covering an upper portion of the real trench 17, and the presence of the interlayer insulating film 21 allows the gate electrode 19 and the emitter electrode 20 to be insulated from each other. A contact hole 22 is selectively formed in the interlayer insulating film 21. The contact hole 22 extends through the interlayer insulating film 21.

The contact hole 22 exposes the diffusion layer 15 of $p^+$-type and part of the emitter layer 16 of $n^+$-type from the interlayer insulating film 21. The barrier metal film 23 is formed all over the front surface 40A of the semiconductor substrate 40 including a region on the interlayer insulating film 21 and an inside of the contact hole 22.

The barrier metal film 23 is in contact with the upper surfaces of the diffusion layer 15 and the emitter layer 16 in the contact hole 22. When the barrier metal film 23 comes into contact with a silicon semiconductor, the barrier metal film 23 is transformed into a silicide, thereby reducing a contact resistance caused by contact with the emitter layer 16 and the diffusion layer 15.

In order to realize finer design rules, a tungsten plug (not shown in FIG. 1) may be formed on the barrier metal film 23. When such a tungsten plug is used for the contact hole 22, the barrier metal film 23 may be a transition metal in order to obtain the above-described effect. For example, the barrier metal film 23 may have a multilayer structure containing titanium or titanium nitride.

The emitter electrode 20 is formed on the barrier metal film 23 or on the barrier metal film 23 and the tungsten plug. FIG. 1 shows a structure where the emitter electrode 20 is formed on the barrier metal film 23. The emitter electrode 20 may be made of an aluminum alloy, for example. The emitter electrode 20 is electrically connected to the emitter layer 16 of $n^+$-type with the barrier metal film 23 interposed between the emitter electrode 20 and the emitter layer 16, and is electrically connected to the diffusion layer 15 of $p^+$-type with the barrier metal film 23 interposed between the emitter electrode 20 and the diffusion layer 15.

In the IGBT region 11, as a back surface structure formed on the back surface of the drift layer 50, for example, a buffer layer 24 of n-type, the collector layer 25 of p-type, and a collector electrode 26 shown in FIG. 1 are formed.

In the IGBT region 11, the buffer layer 24 is provided on a lower surface of the drift layer 50 on the −Z direction side, and the collector layer 25 is provided on a lower surface of the buffer layer 24. Further, the collector electrode 26 is provided on the lower surface of the collector layer 25. As shown in FIG. 1 and FIG. 3, the collector layer 25 is provided extending into the diode region 12 by a protruding distance Wop in a horizontal direction that is the X direction relative to an end of the emitter layer 16. That is, the collector layer 25 extends by the protruding distance Wop in the horizontal direction relative to a boundary between the IGBT region 11 and the diode region 12.

Herein, Wop in a case of a protrusion from the IGBT region 11 into the diode region 12 is defined as a distance in a positive direction, and Wop in a case of a protrusion from the diode region 12 into the IGBT region 11 is defined as a distance in a negative direction.

The semiconductor device 10 serving as an RC-IGBT that has such an IGBT region 11 has high channel density owing to a trench MOS gate structure having the base layer 14 of p-type, the diffusion layer 15 of $p^+$-type, the insulating film 18, and the gate electrode 19.

Further, the thinner the drift layer 50 of $n^-$-type is, the lower the loss becomes. When the drift layer 50 of $n^-$-type is made thinner, a stopper for a depletion layer extending from a p-n junction between the base layer 14 of p-type and the drift layer 50 of $n^-$-type when the IGBT is switched off is required. As such a stopper, the buffer layer 24 of n-type that is higher in impurity concentration than the drift layer 50 of $n^-$-type is provided. Note that the presence or absence of the buffer layer 24 is determined depending on uses of products, and the buffer layer 24 may be omitted depending on uses of products.

The IGBT including the emitter electrode 20, the diffusion layer 15, the emitter layer 16, the base layer 14, the drift layer 50, the buffer layer 24, the collector layer 25, the collector electrode 26, the gate electrode 19, and the insulating film 18 described above as main components is provided in the IGBT region 11.

A description will be given below of an operation when the IGBT is on. The IGBT is a bipolar element that uses electron carriers and hole carriers to operate. When the IGBT is on, the base layer 14 of p-type, the emitter layer 16 of $n^+$-type, the insulating film 18, and the gate electrode 19 bring an n-channel MOS gate structure into a conductive state.

In the IGBT region 11, a current flows through a path extending from the collector layer 25 of p-type to the emitter layer 16 of $n^+$-type through the buffer layer 24 of n-type, the drift layer 50 of $n^-$-type, and the base layer 14 of p-type.

As described above, the base layer 14 of p-type, the emitter layer 16 of $n^+$-type, the insulating film 18, and the gate electrode 19 form a trench-shaped MOS gate structure, and a plurality of such MOS gate structures are formed in the IGBT region 11.

In such a configuration, applying a positive voltage to the gate electrode 19 to form an n-type channel region in part of the base layer 14 while applying a positive voltage to the collector electrode 26 puts the IGBT into operation.

While the IGBT is in operation, the IGBT accumulates electron carriers and hole carriers in the drift layer 50 to bring about conductivity modulation, thereby making an on-state resistance lower. In order to lower an on-state voltage of the IGBT, it is necessary to increase a carrier accumulation effect.

Figure 4:
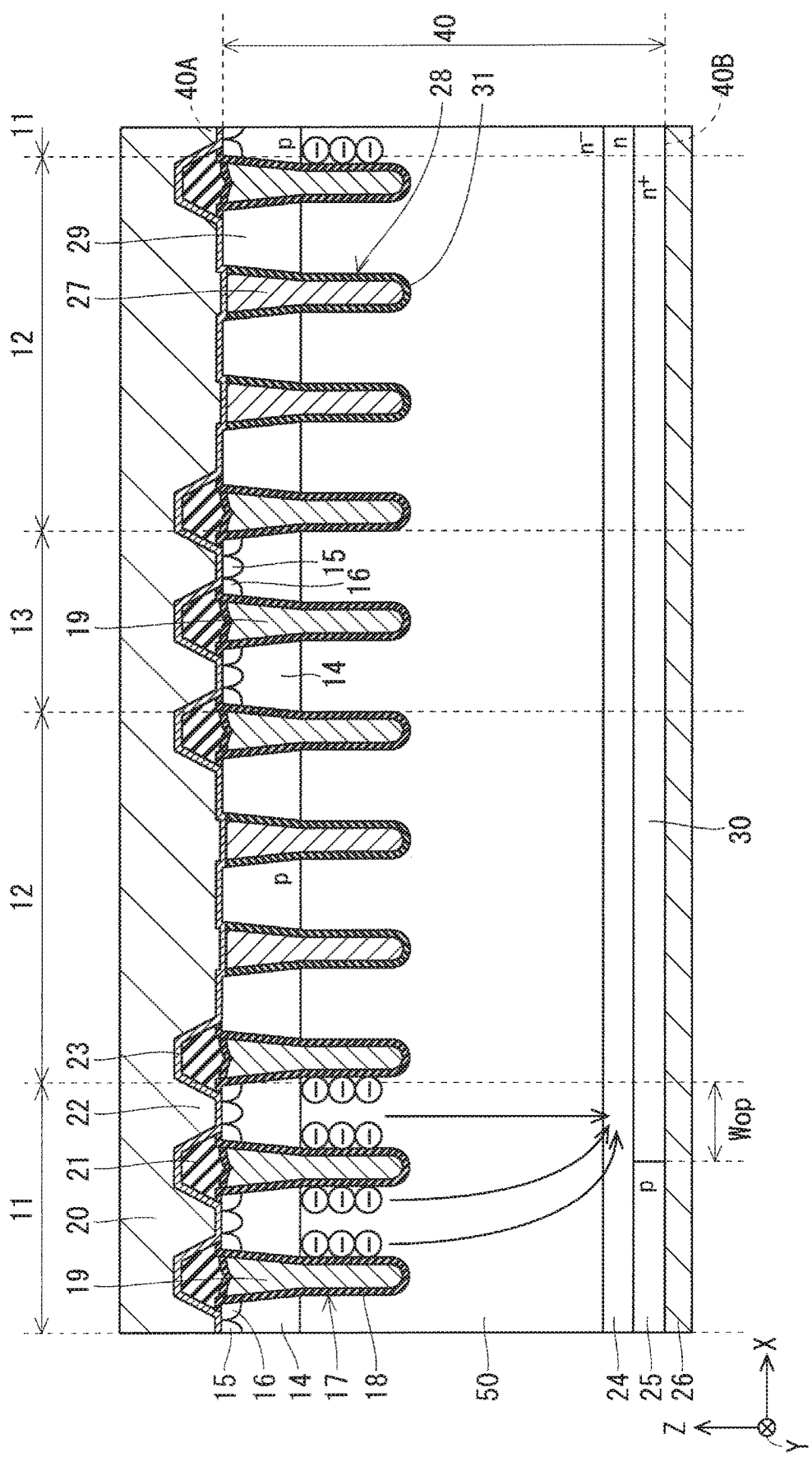
FIG. 4 is a cross-sectional view of a structure of a semiconductor device for comparison with the semiconductor device of the first preferred embodiment.

FIG. 4 is a cross-sectional view of a structure of a semiconductor device for comparison with the semiconductor device 10 of the first preferred embodiment.

Assuming that the protruding distance Wop is "0" or negative, in FIG. 4, a protrusion is made from the diode region 12 into the IGBT region 11 by a negative protruding distance Wop.

In the semiconductor device for comparison shown in FIG. 4, electron carriers flow from the emitter layer 16 of $n^+$-type, without being accumulated in the drift layer 50 of $n^-$-type, into the buffer layer 24 of n-type and the cathode layer 30 of $n^+$-type in the diode region 12, thereby making the carrier accumulation effect of the IGBT lower.

Therefore, making the protruding distance Wop positive as shown in FIG. 1 makes a horizontal distance in the X direction between the emitter layer 16 of $n^+$-type and the buffer layer 24 of n-type provided on the cathode layer 30 longer, which in turn makes a resistance component of the drift layer 50 larger. As a result, electron carriers do not flow into the buffer layer 24 of n-type but are accumulated in the drift layer 50, thereby making the on-state voltage of the IGBT lower.

Note that the diffusion layer 15 of $p^+$-type has an effect of sweeping out carriers generated when the IGBT is switched off and lowering a contact resistance with the emitter electrode 20. The above describes the configuration of the IGBT region 11 and the operation of the IGBT.

Next, a description will be given of a structure of the MOSFET region 13 and a basic operation of the MOSFET with reference to FIG. 1 to FIG. 3. A configuration of the MOSFET region 13 adjacent to the front surface 40A is the same as the structure of the IGBT region 11. The MOSFET region 13 is the same as the IGBT region 11 in configuration of each of the emitter electrode 20, the interlayer insulating film 21, the barrier metal film 23, the real trench 17, the insulating film 18, the gate electrode 19, the contact hole 22, the base layer 14, the diffusion layer 15, and the emitter layer 16 shown in FIG. 1.

Note that the structure shown in FIG. 1 is an example, and the configurations of the IGBT region 11 and the MOSFET region 13 on the front surface 40A side may be different from each other. However, forming the IGBT region 11 and the MOSFET region 13 under the same process conditions makes it possible to manufacture the semiconductor device 10 having the structure shown in FIG. 1 at lower cost.

In the MOSFET region 13, as a back surface structure formed on the back surface of the drift layer 50, the buffer layer 24 of n-type, the cathode layer 30 of $n^+$-type, and the collector electrode 26 shown in FIG. 1 are provided.

In the MOSFET region 13, the buffer layer 24 is provided on the lower surface of the drift layer 50 on the −Z direction side, and the cathode layer 30 is provided on the lower surface of the buffer layer 24. The collector electrode 26 is provided on the lower surface of the cathode layer 30.

The MOSFET including the emitter electrode 20, the emitter layer 16, the base layer 14, the drift layer 50, the buffer layer 24, the cathode layer 30, the collector electrode 26, the gate electrode 19, and the insulating film 18 described above as main components is provided in the MOSFET region 13. Note that, in the MOSFET region 13, one of the emitter electrode 20 and the collector electrode 26 serves as a drain electrode, and the other serves as a source electrode.

A description will be given below of an operation when the MOSFET is on. The MOSFET has an n-channel MOS gate structure including the base layer 14 of p-type, the emitter layer 16 of $n^+$-type, the insulating film 18, the gate electrode 19, and the drift layer 50 of $n^-$-type as main components. Electron carriers flow from the drift layer 50 of $n^-$-type to the collector electrode 26 through the buffer layer 24 of n-type and the cathode layer 30 of $n^+$-type.

The MOSFET also includes a built-in diode. When a positive voltage is applied to the emitter electrode 20 with a zero or negative voltage applied to the gate electrode 19, hole carriers are injected from the base layer 14 of p-type into the drift layer 50 of $n^-$-type, and electron carriers are injected from the cathode layer 30 of $n^+$-type into the drift layer 50. That is, in the MOSFET region 13, when no positive voltage is applied to the gate electrode 19, the built-in diode can be put into operation.

When the applied voltage becomes equal to or larger than a voltage drop, the built-in diode is brought into the on-state. Herein, the applied voltage denotes a voltage applied between the emitter electrode 20 being a positive side and the collector electrode 26.

In the MOSFET region 13, when the built-in diode is brought into the on-state, a current flows through a path extending from the emitter electrode 20 to the collector electrode 26 through the base layer 14 of p-type, the drift layer 50 of n⁻-type, the buffer layer 24 of n-type, and the cathode layer 30 of n⁺-type.

Next, a description will be given of a structure of the diode region 12 and a basic operation of the diode with reference to FIG. 1 to FIG. 3. In the diode region 12, the drift layer 50 of n⁻-type, the dummy trench 28, and the anode layer 29 of p-type are provided in the semiconductor substrate 40.

The drift layer 50 is shared among the IGBT region 11, the MOSFET region 13, and the diode region 12. In the diode region 12, the anode layer 29 is formed on the upper surface of the drift layer 50 in the +Z direction. That is, the anode layer 29 of p-type is provided adjacent to the front surface 40A of the semiconductor substrate 40.

A plurality of the dummy trenches 28 are formed in a region extending from the upper surface of the anode layer 29 into the drift layer 50 through the anode layer 29. The dummy gate electrode 27 that is in contact with the insulating film 31 is buried in the dummy trench 28 with the insulating film 31 serving as a dummy gate insulating film interposed between the dummy gate electrode 27 and the anode layer 29 and the drift layer 50. The dummy gate electrode 27 serving as a dummy buried conductive layer may be made of a conductive material such as polysilicon. As described above, in the diode region 12, the dummy trench 28 is provided adjacent to the front surface 40A of the semiconductor substrate 40, as with the real trench 17 in the IGBT region 11 and the MOSFET region 13.

In the diode region 12, as a surface structure formed on the surfaces of the anode layer 29, the dummy gate electrode 27, and the diffusion layer 15, the emitter electrode 20, the interlayer insulating film 21, and the barrier metal film 23 shown in FIG. 1 are formed.

The barrier metal film 23 is formed all over the front surface 40A of the semiconductor substrate 40 including a region on the interlayer insulating film 21 and the anode layer 29. Note that the barrier metal film 23 is formed on the surface of the dummy gate electrode 27. The emitter electrode 20 is formed on the upper surface of the barrier metal film 23.

The emitter electrode 20 is an electrode shared among the IGBT region 11, the diode region 12, and the MOSFET region 13. The emitter electrode 20 is made of, for example, an aluminum alloy. The structure where the emitter electrode 20 is shared among the IGBT region 11, the diode region 12, and the MOSFET region 13 allows the same condition for wire bonding or solder wettability in an assembly process using the semiconductor device 10 to be applied to the IGBT region 11, the diode region 12, and the MOSFET region 13.

Since the p-type impurity concentration of the anode layer 29 of p-type is relatively low, excellent diode characteristics can be obtained. However, a Schottky barrier junction is formed between the anode layer 29 of the p-type and the barrier metal film 23 in contact with each other, thereby increasing the contact resistance. Therefore, an aspect where the barrier metal film 23 is not provided in the diode region 12 is also conceivable. When the barrier metal film 23 is in contact with the anode layer 29, an increase in the p-type impurity concentration of the anode layer 29 of p-type can bring the contact into an ohmic contact.

In the diode region 12, as a back surface structure formed on the back surface of the drift layer 50, the buffer layer 24 of n-type, the cathode layer 30 of n⁺-type, and the collector electrode 26 shown in FIG. 1 are provided.

In the diode region 12, the buffer layer 24 is provided on the lower surface of the drift layer 50 on the −Z direction side, and the cathode layer 30 is provided on the lower surface of the buffer layer 24. The collector electrode 26 is provided on the lower surface of the cathode layer 30.

The buffer layer 24 of n-type and the collector electrode 26 can be shared among the IGBT region 11, the diode region 12, and the MOSFET region 13. Further, the cathode layer 30 can be shared between the diode region 12 and the MOSFET region 13.

The diode including the emitter electrode 20, the anode layer 29, the drift layer 50, the buffer layer 24, the cathode layer 30, and the collector electrode 26 described above as main components is provided in the diode region 12. In the diode region 12, the emitter electrode 20 serves as an anode electrode, and the collector electrode 26 serves as a cathode electrode.

A description will be given below of an operation when the diode is on. When a positive voltage is applied between the emitter electrode 20 being a positive side and the collector electrode 26, hole carriers are injected from the anode layer 29 of p-type to the drift layer 50, and electron carriers are injected from the cathode layer 30 of n⁺-type to the drift layer 50. When the applied voltage becomes equal to or larger than a voltage drop, the diode is brought into the on-state. When the diode is brought into the on-state, a current flows through a path extending from the emitter electrode 20 to the collector electrode 26 through the anode layer 29 of p-type, the drift layer 50 of n⁻-type, the buffer layer 24 of n-type, and the cathode layer 30 of n⁺-type.

A description will be given below of an operation when the diode is off. In general, the diode performs a recovery operation when switching from on to off. The recovery operation is an operation in which a current flows to the negative voltage side of the diode for a short time and then the diode returns to the off-state, and this period is called a reverse recovery time. Further, a peak value of the negative current flowing during the reverse recovery time is called a recovery current, and a loss that occurs during the reverse recovery time is called a recovery loss.

When the diode is off, applying a positive voltage to the dummy gate electrode 27 provided at a boundary between the diode region 12 and the IGBT region 11 or the MOSFET region 13 allows electron carriers to be supplied to the diode region 12. The electron carriers recombine with hole carriers that becomes the recovery current, which results in an excellent conduction loss and an excellent recovery loss.

The above describes the configurations of the IGBT region 11, the diode region 12, and the MOSFET region 13, and the basic operations of the IGBT, the diode, and the MOSFET.

A current during the on-state operation of the MOSFET increases linearly relative to a collector voltage, allowing the on-state voltage in the low-current range to be lower than the on-state voltage of the IGBT. On the other hand, in the high-current range, the IGBT whose on-state resistance is made lower by conductivity modulation is lower in on-state voltage.

The semiconductor device 10 of the first preferred embodiment is provided with both the IGBT region 11 having the IGBT and the MOSFET region 13 having the MOSFET and thus can exhibit excellent electrical characteristics from a low-current range to a high-current range.

On the other hand, additionally providing the MOSFET region 13 increases the size of the structure of the semiconductor device 10. Further, to prevent the size of the entire structure of the semiconductor device 10 from being increased, it is necessary to reduce the formation area of the IGBT region 11 and the diode region 12 by an area where the MOSFET region 13 is provided.

However, since the MOSFET region 13 includes the built-in diode, effectively using the built-in diode in the MOSFET region 13 as an on-state operation region can prevent the diode operation as an RC-IGBT from being obstructed, without increasing the size of the structure of the semiconductor device 10.

The semiconductor device 10 of the first preferred embodiment is a low-cost semiconductor device that is provided with the MOSFET region 13 to minimize the increase in size of the device and has a lower loss in both the forward direction and the reverse direction.

A description will be given below of an arrangement. In the semiconductor device 10 of the first preferred embodiment, the IGBT region 11 and the MOSFET region 13 are not arranged adjacent to each other.

When the IGBT region 11 and the MOSFET region 13 are arranged adjacent to each other, the cathode layer 30 of $n^+$-type is present in the back surface structure of the MOSFET region 13, so that the horizontal distance in the X direction between the emitter layer 16 of $n^+$-type in the IGBT region 11 and the cathode layer 30 of $n^+$-type is shorter, thereby reducing a resistance component of the drift layer 50 in the IGBT region 11.

This prevents, during the on-state operation of the IGBT, electron carriers from being accumulated and thus obstructs conductivity modulation. To address such a problem, it is effective to provide the protruding distance Wop on the positive side.

However, when the IGBT region 11 and the MOSFET region 13 are arranged adjacent to each other, the formation region of the cathode layer 30 of $n^+$-type formed on the back surface of the MOSFET region 13 is reduced by the protruding distance Wop. That is, in the MOSFET region 13, the region that operates as the MOSFET is reduced by the protruding distance Wop, so that it is substantially impossible to provide the protruding distance Wop on the positive side.

On the other hand, even when the IGBT region 11 and the diode region 12 are arranged adjacent to each other and the protruding distance Wop of the collector layer 25 is provided on the positive side, the MOSFET operating region in the MOSFET region 13 is not affected.

Therefore, in the semiconductor device 10 of the first preferred embodiment, the diode region 12 is always disposed between the IGBT region 11 and the MOSFET region 13 to cause the IGBT region 11 and the MOSFET region 13 to be separated from each other without being adjacent to each other.

(Effects)

Since the semiconductor device 10 of the first preferred embodiment includes the MOSFET region 13 having the MOSFET in addition to the IGBT region 11, it is possible to reduce the on-state voltage in a range from the low-current range to the high-current range.

In the semiconductor device 10, since the IGBT region 11 and the MOSFET region 13 are separated from each other without being adjacent to each other, the IGBT operation made by the IGBT and the MOSFET operation made by the MOSFET do not interfere with each other.

Therefore, even when the protruding distance Wop is provided on the positive side, and conductivity modulation in the IGBT of the IGBT region 11 is favorably made, the MOSFET operation of the MOSFET region 13 is not adversely affected.

As a result, the semiconductor device 10 of the first preferred embodiment can perform both the IGBT operation and the MOSFET operation with high accuracy, and thus exhibits excellent electrical characteristics.

Further, since the drift layer 50 is shared among the IGBT region 11, the diode region 12, and the MOSFET region 13, the manufacturing process is made easier, and thus the manufacturing cost can be reduced.

Note that the base layer 14 can be used as the anode layer 29 when the base layer 14 is made identical in p-type impurity concentration to the anode layer 29. Since the base layer 14 can also be shared among the IGBT region 11, the diode region 12, and the MOSFET region 13, the manufacturing cost can be reduced.

Since the semiconductor device 10 of the first preferred embodiment includes the dummy gate electrode 27 that is a dummy buried conductive layer, electric field concentration at the boundary between the IGBT region 11 and the diode region 12 and the boundary between the MOSFET region 13 and the diode region 12 can be reduced, and thus the breakdown voltage of the diode region 12 can be increased.

Furthermore, in the semiconductor device 10 of the first preferred embodiment, providing the positive protruding distance Wop in the collector layer 25 allows the horizontal distance, in the drift layer 50 of the IGBT region 11, from the emitter layer 16 of the IGBT region 11 to the collector layer 25 of the diode region 12 to be longer, so that the resistance component of the IGBT drift layer that is the drift layer 50 formed in the IGBT region 11 can be increased.

As a result, in the semiconductor device 10 of the first preferred embodiment, electron carriers flowing through the IGBT region 11 do not flow into the cathode layer 30 of the diode region 12, but are accumulated in the IGBT drift layer, so that the on-state voltage while the IGBT is in operation can be reduced.

Second to Fifth Preferred Embodiments

Second to fifth preferred embodiments to be described below have much in common with the semiconductor device 10 of the first preferred embodiment. Accordingly, a description will be given mainly of differences from the first preferred embodiment with common points with the first preferred embodiment assigned the same reference numerals and no description given of the common points as needed.

Further, the following names are used when classifying components such as the drift layer 50 formed in the IGBT region 11, the diode region 12, and the MOSFET region 13.

Regarding the drift layer 50, the drift layer 50 formed in the IGBT region 11 may be referred to as an IGBT drift layer, the drift layer 50 formed in the diode region 12 may be referred to as a diode drift layer, and the drift layer 50 formed in the MOSFET region 13 may be referred to as a MOSFET drift layer.

Regarding the base layer 14, the base layer 14 formed in the IGBT region 11 may be referred to as an IGBT base layer, and the base layer 14 formed in the MOSFET region 13 may be referred to as a MOSFET base layer.

Regarding the gate electrode 19 and the dummy gate electrode 27, the gate electrode 19 formed in the IGBT region 11 may be referred to as an IGBT buried conductive layer, the dummy gate electrode 27 formed in the diode region 12 may be referred to as a dummy buried conductive layer, and the gate electrode 19 formed in the MOSFET region 13 may be referred to as a MOSFET buried conductive layer.

Regarding the MOS gate structure, the MOS gate structure formed in the IGBT region 11 may be referred to as an IGBT MOS gate structure, and the MOS gate structure formed in the MOSFET region 13 may be referred to as a MOSFET MOS gate structure.

Note that, in the diode region 12, the dummy buried conductive layer provided at the boundary between the diode region 12 and the IGBT region 11 or the MOSFET region 13 serves as a gate of the MOS gate structure on both sides adjacent to the IGBT region 11 and the MOSFET region 13.

Second Preferred Embodiment

Figure 5:
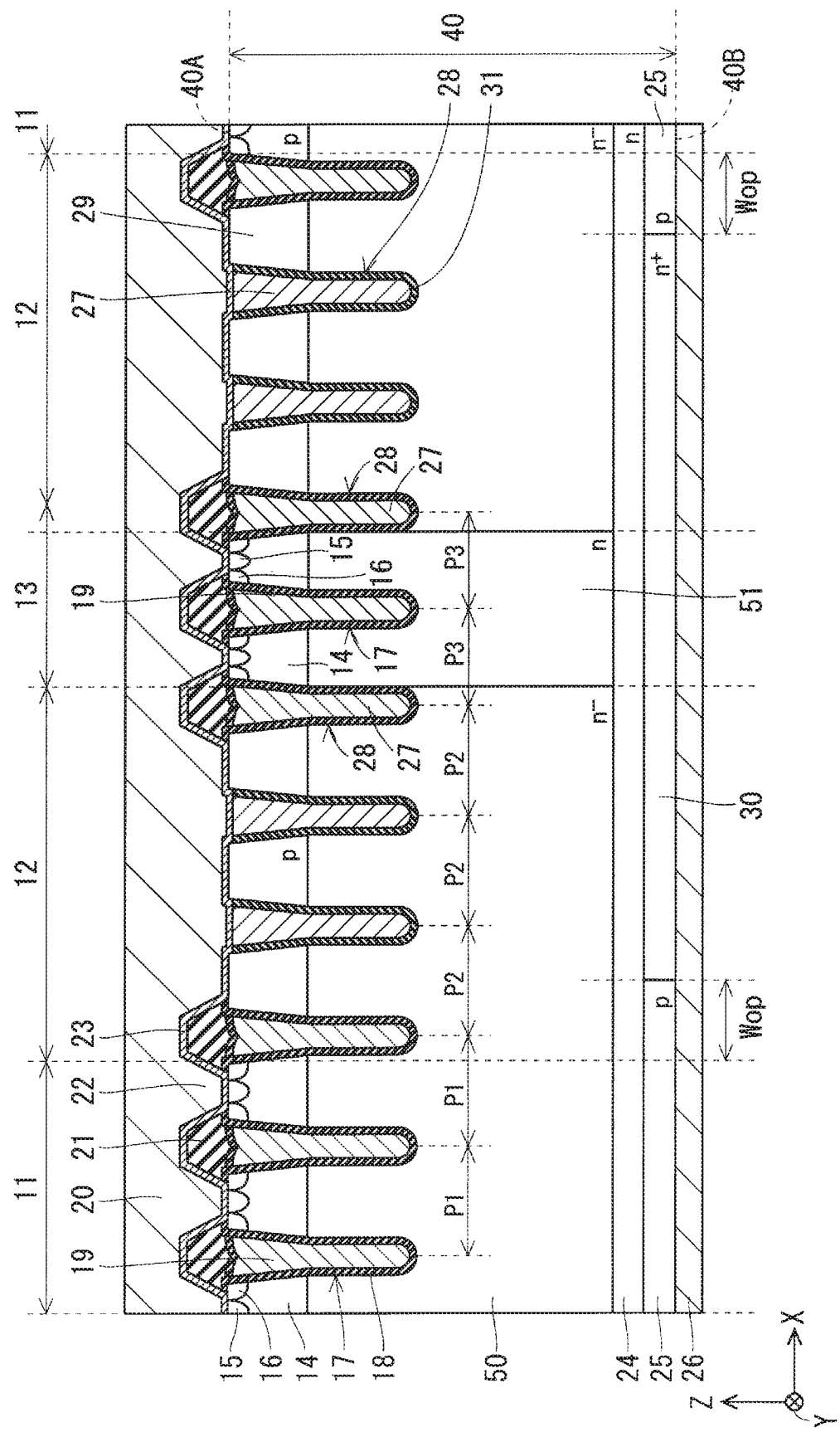
FIG. 5 is a cross-sectional view of a structure of a semiconductor device of a second preferred embodiment.

FIG. 5 is a cross-sectional view of a structure of a semiconductor device 10B according to a second preferred embodiment.

The semiconductor device 10B of the second preferred embodiment is characterized by being provided with a heavily doped drift layer 51 of n-type as the MOSFET drift layer that is a drift layer formed in the MOSFET region 13 in order to reduce the on-state resistance while the MOSFET of the MOSFET region 13 is in operation. The heavily doped drift layer 51 is provided all over the drift layer 50 of the MOSFET region 13 in the semiconductor device 10 of the first preferred embodiment shown in FIG. 1.

The n-type impurity concentration of the heavily doped drift layer 51 is made higher than the $n^-$-type impurity concentration of the IGBT drift layer that is the drift layer 50 of the IGBT region 11 and the diode drift layer that is the drift layer 50 of the diode region 12.

Providing, in the MOSFET region 13, the heavily doped drift layer 51 higher in n-type impurity concentration than the IGBT drift layer and the diode drift layer reduces the resistance component of the heavily doped drift layer 51 of the MOSFET region 13 and reduces the on-state resistance while the MOSFET is in operation.

After forming the drift layer 50, the drift layer 50 is doped with n-type impurities to become the heavily doped drift layer 51. Forming the heavily doped drift layer 51 by doping with impurities can eliminate the need for epitaxially growth of each of the heavily doped drift layer 51 and the drift layer 50.

Note that the impurities used for forming the heavily doped drift layer 51 may be introduced from the front surface 40A of the semiconductor substrate 40 or from the back surface 40B of the semiconductor substrate 40. Further, the impurities may be introduced from both the front surface 40A and the back surface 40B of the semiconductor substrate 40.

As described above, in the semiconductor device 10B of the second preferred embodiment, the heavily doped drift layer 51 that is the MOSFET drift layer serves as a drift heavily doped region that is higher in n-type impurity concentration than the IGBT drift layer and the diode drift layer, so that the on-state resistance while the MOSFET is in operation can be reduced.

In FIG. 1, the heavily doped drift layer 51 is provided all over the MOSFET drift layer. However, even when the drift heavily doped region is formed in part of the MOSFET drift layer, it is possible to exhibit the effect of reducing the on-state resistance while the MOSFET of the MOSFET region 13 is in operation.

However, as with the heavily doped drift layer 51 of the semiconductor device 10B of the second preferred embodiment, it is possible to maximize the reduction of the on-state resistance while the MOSFET is in operation when the drift heavily doped region is provided all over the MOSFET drift layer.

(Increase in Breakdown Voltage)

As the heavily doped drift layer 51 is provided as the MOSFET drift layer, electric field concentration tends to occur near a bottom of the MOSFET buried conductive layer in the heavily doped drift layer 51, which raises a concern about a decrease in breakdown voltage of the MOSFET region 13. In view of this concern, in the semiconductor device 10B of the second preferred embodiment, an increase in breakdown voltage of the MOSFET region 13 is additionally made.

In the IGBT region 11, each of a plurality of the IGBT buried conductive layers is formed adjacent to and equally spaced apart from another IGBT buried conductive layer or the dummy buried conductive layer by a pitch P1 that is an IGBT gap. Note that the pitch P1 is equal to a gap between the real trenches 17, 17 in the IGBT region 11 and a gap between the real trench 17 and the dummy trench 28.

In the diode region 12, a plurality of the dummy buried conductive layers are formed adjacent to and equally spaced apart from each other by a pitch P2 that is a dummy gap. Note that the pitch P2 is equal to a gap between the dummy trenches 28, 28 in the diode region 12.

One MOSFET buried conductive layer is formed adjacent to and spaced apart from the dummy buried conductive layer by a pitch P3 that is a MOSFET gap. The pitch P3 is equal to a gap between the real trenches 17, 17 in the MOSFET region 13 and a gap between the real trench 17 and the dummy trench 28.

The semiconductor device 10B of the second preferred embodiment further has a characteristic that the pitch P3 is made smaller than the pitch P1 and the pitch P2, as shown in FIG. 5.

In the semiconductor device 10B of the second preferred embodiment, the pitch P3 in the MOSFET region 13 is made smaller than the pitch P1 in the IGBT region 11 and the pitch P2 in the diode region 12, so that electric field concentration in the heavily doped drift layer 51 can be reduced, and thus the breakdown voltage in the MOSFET region 13 can be increased.

Therefore, the semiconductor device 10B of the second preferred embodiment can reduce the on-state resistance without reducing a static breakdown voltage to reduce a steady loss in the forward direction.

Note that the semiconductor device 10B of the second preferred embodiment includes a plurality of IGBT buried conductive layers and one MOSFET buried conductive layer, but at least one IGBT buried conductive layer and at least one MOSFET buried conductive layer only need to be provided.

Each of the at least one IGBT buried conductive layer is formed adjacent to and equally spaced apart from another IGBT buried conductive layer or the dummy buried conductive layer by the pitch P1, and each of the at least one MOSFET buried conductive layer is formed adjacent to and equally spaced apart from another MOSFET buried conductive layer or the dummy buried conductive layer by the pitch P3.

Third Preferred Embodiment

Figure 6:
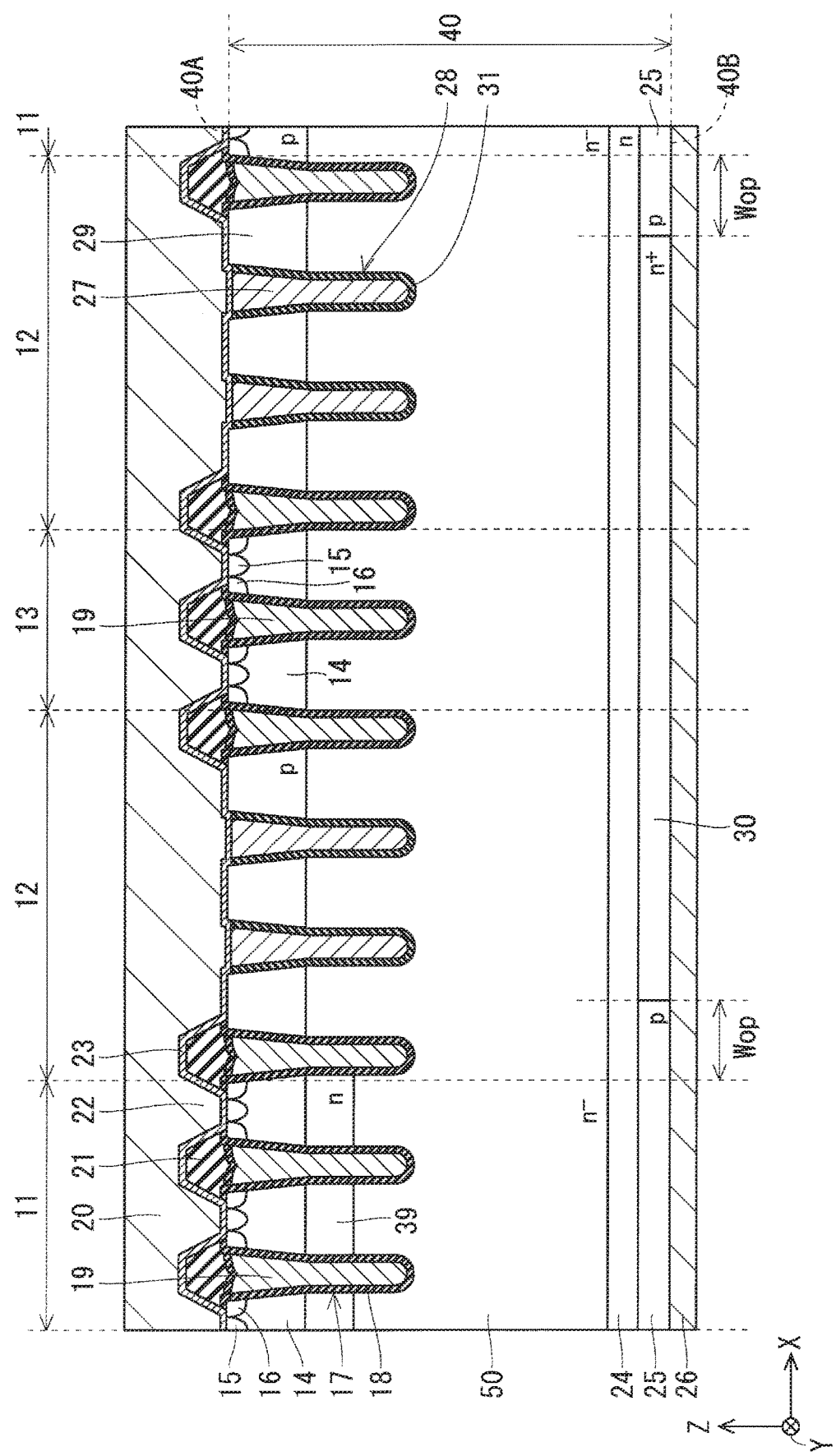
FIG. 6 is a cross-sectional view of a structure of a semiconductor device according to a third preferred embodiment.

FIG. 6 is a cross-sectional view of a structure of a semiconductor device 10C according to a third preferred embodiment.

As shown in FIG. 6, the semiconductor device 10C is provided with a carrier store layer 39 of n-type immediately below the base layer 14 in the drift layer 50 of the IGBT region 11 serving as the IGBT drift layer. The carrier store layer 39 is made higher in n-type impurity concentration than the drift layer 50.

That is, in the IGBT region 11, the drift layer 50 includes the carrier store layer 39 serving as a carrier store region that is higher in impurity concentration of n-type that is the first conductivity type than the other regions of the drift layer 50, the carrier store layer 39 being in contact with the base layer 14.

The semiconductor device 10C of the third preferred embodiment accumulates carriers supplied from the IGBT collector electrode 26 in the carrier store layer 39 to bring about conductivity modulation, thereby making the on-state resistance while the IGBT is in operation lower.

Note that, as shown in FIG. 6, it is desirable that the carrier store layer 39 be formed all over an interface with the base layer 14 in the IGBT region 11. This is because such an overall formation makes it possible to effectively reduce the on-state resistance in the base layer 14 of p-type and the drift layer 50 of n⁻-type during IGBT conduction and thus further reduce the steady loss.

The carrier store layer 39 may be provided in the upper portion of the drift layer 50 not only in the IGBT region 11, but also in each of the diode region 12 and the MOSFET region 13 in the same manner as the above-described overall formation. The overall formation of the carrier store layer 39 in each of the IGBT region 11, the diode region 12, and the MOSFET region 13 eliminates the need for a photolithography process during manufacture of the carrier store layer 39, so that the manufacturing cost can be reduced. At this time, the effect of reducing the above-described steady loss can be also exhibited.

Modification

As a modification of the semiconductor device 10C of the third preferred embodiment, a structure where a heavily doped drift region corresponding to heavily doped drift layer 51 shown in FIG. 5 is further formed in the MOSFET drift layer based on the structure shown in FIG. 6 is conceivable.

Furthermore, the modification of the third preferred embodiment is characterized in that the carrier store layer 39 and the heavily doped drift region are made identical to each other in both impurity concentration of n-type that is the first conductivity type and formation depth.

According to the modification of the third preferred embodiment having the above-described characteristics, the carrier store layer 39 serving as the carrier store region in the IGBT region 11, and the drift heavily doped region in the MOSFET region 13 can be manufactured by the same manufacturing process.

As a result, according to the modification of the third preferred embodiment, such a relatively easy manufacturing method makes it possible to reduce the on-state resistance in the MOSFET region 13 while the MOSFET is in operation and the on-state resistance in the IGBT region 11 while the IGBT is in operation.

Fourth Preferred Embodiment

Figure 7:
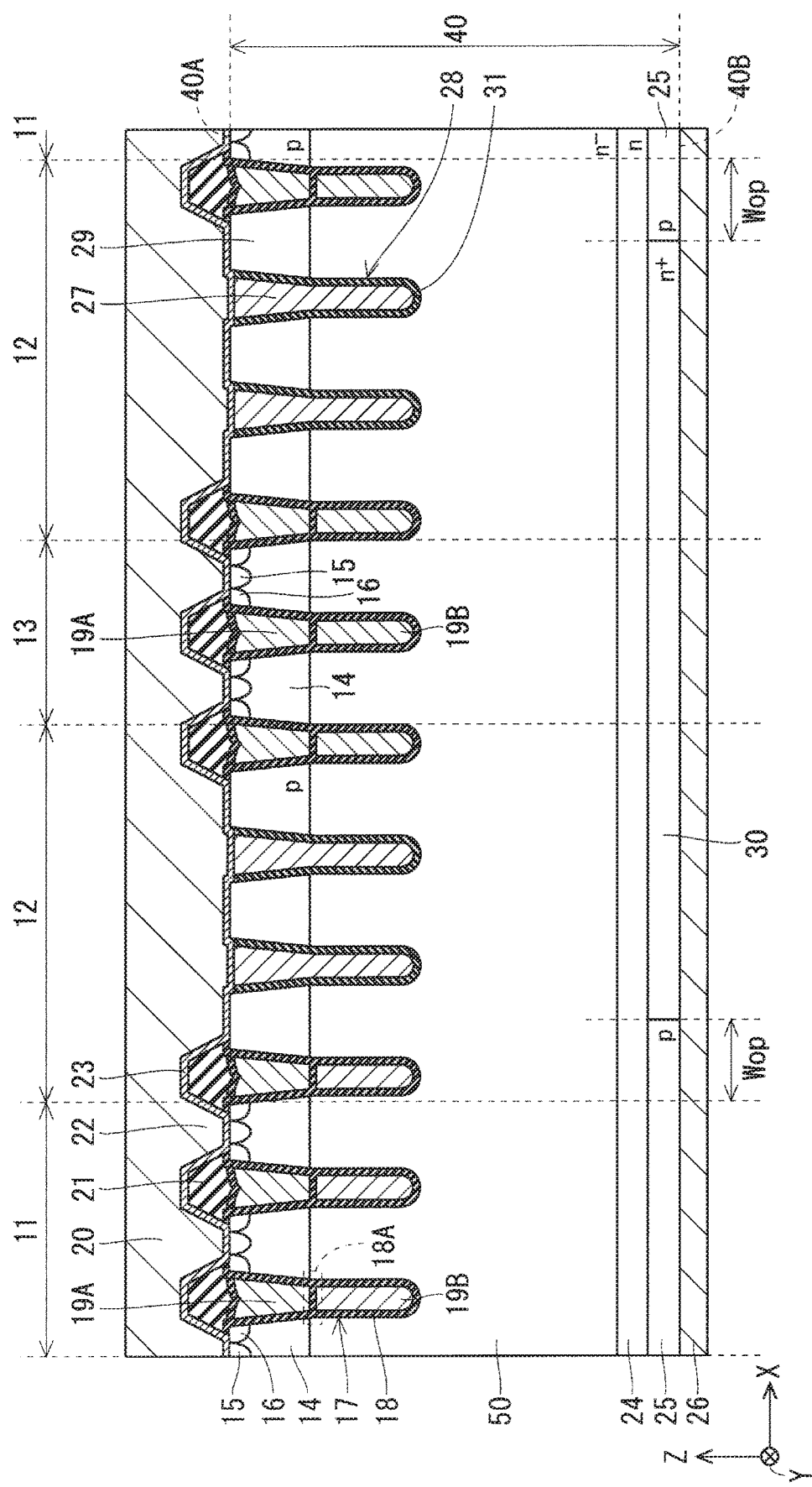
FIG. 7 is a cross-sectional view of a structure of a semiconductor device of a fourth preferred embodiment.

FIG. 7 is a cross-sectional view of a structure of a semiconductor device 10D according to a fourth preferred embodiment.

As shown in FIG. 7, the semiconductor device 10D of the fourth preferred embodiment is characterized in that two electrodes, that is, an upper electrode 19A and a lower electrode 19B are provided in each of the real trenches 17 in the IGBT region 11 and the MOSFET region 13.

In each of the IGBT region 11 and the MOSFET region 13, the upper electrode 19A and the lower electrode 19B are insulated and separated from each other by an insulating film 18A interposed between the upper electrode 19A and the lower electrode 19B.

The upper electrode 19A is used as a gate electrode of the MOS gate structure, as with the gate electrode 19 of the first to third preferred embodiments. On the other hand, the lower electrode 19B is electrically connected to the emitter electrode 20 or is brought into a floating state to establish an electrical connection relationship other than the gate electrode of the MOS gate structure.

Note that both the upper electrode 19A and the lower electrode 19B may serve as gate electrodes of the MOS gate structure.

As described above, in the semiconductor device 10D of the fourth preferred embodiment, the IGBT buried conductive layer includes the upper electrode 19A and the lower electrode 19B as a plurality of partial IGBT buried conductive layers that are electrically separated from each other.

Further, in the semiconductor device 10D of the fourth preferred embodiment, the MOSFET buried conductive layer includes the upper electrode 19A and the lower electrode 19B as a plurality of partial MOSFET buried conductive layers that are electrically separated from each other.

In the semiconductor device 10D of the fourth preferred embodiment, in the IGBT region 11 and the MOSFET region 13, an electrode serving as the gate electrode of the MOS gate structure can be selected from the upper electrode 19A and the lower electrode 19B.

That is, a layer used as the gate electrode of the MOS gate structure can be selected from the plurality of partial IGBT buried conductive layers, and a layer used as the gate electrode of the MOS gate structure can be selected from the plurality of partial MOSFET buried conductive layers.

As a result, the semiconductor device 10D of the fourth preferred embodiment can adjust capacitance of the insulating film 18 formed between the gate electrode and the collector electrode 26 of the MOS gate structure in each of the IGBT region 11 and the MOSFET region 13 to enable characteristics suitable for the switching operation of the IGBT or the MOSFET.

For example, when the capacitance of the insulating film 18 formed between the gate electrode and the collector electrode 26 of the MOS gate structure is increased, the switching loss while the IGBT or MOSFET is in operation tends to increase. Therefore, in order to effectively suppress the switching loss, the semiconductor device 10D of the fourth preferred embodiment that can adjust the capacitance of the insulating film 18 is effective.

In particular, providing the above-described upper electrode 19A and lower electrode 19B at least in the IGBT region 11 makes it possible to enable characteristics suitable for the switching operation of the IGBT to adapt to various conditions.

Note that the upper and lower two-stage electrode structure with the insulating film 18A interposed between the upper and lower electrodes, like the upper electrode 19A and the lower electrode 19B, is applied to the semiconductor device 10D shown in FIG. 6, but the present invention is not limited to this structure. For example, other than the upper and lower two-stage electrode structure, a split structure where an electrode is divided into two left and right electrode columns, and an insulating film is provided between the electrode columns to prevent the electrode columns from interfering with each other, or a convex insulating film structure where the insulating film 18 is made relatively thick in a region on the back surface 40B side adjacent to the drift layer 50 and is made relatively thin in a region formed adjacent to the base layer 14 serving as the channel region may be employed. Any of the structures can adjust the capacitance between the gate electrode and the collector electrode 26 of the MOS gate structure and has an effect of reducing the switching loss.

Modification

As a modification of the fourth preferred embodiment, it is conceivable that a structure corresponding to the upper electrode 19A and the lower electrode 19B that are insulated and separated from each other by the insulating film 18A is employed as the dummy buried conductive layer, as with the IGBT buried conductive layer and the MOSFET buried conductive layer.

That is, according to the modification of the fourth preferred embodiment, the dummy buried conductive layer is further characterized by including a plurality of partial dummy buried conductive layers that are electrically separated from each other.

The modification of the fourth preferred embodiment having the above characteristics sets the structure and electrical specification of the plurality of partial MOSFET buried conductive layers and the plurality of partial dummy buried conductive layers under the same condition as the plurality of partial IGBT buried conductive layers.

Therefore, according to the modification of the fourth preferred embodiment, it is possible to simplify the manufacturing process by manufacturing the MOSFET buried conductive layer, the dummy buried conductive layer, and the IGBT buried conductive layer in the same manufacturing process.

Fifth Preferred Embodiment

When the built-in diode in MOSFET region 13 performs an on-state operation with a positive voltage applied to the gate electrode 19 of each of the semiconductor devices 10, 10B and 10C of the first to third preferred embodiments, the built-in diode does not function because the channel resistance is smaller than the breakdown voltage of the built-in diode.

To address such a problem, according to a fifth preferred embodiment, the MOSFET region 13 is made higher in threshold voltage than the IGBT region 11.

Figure 8:
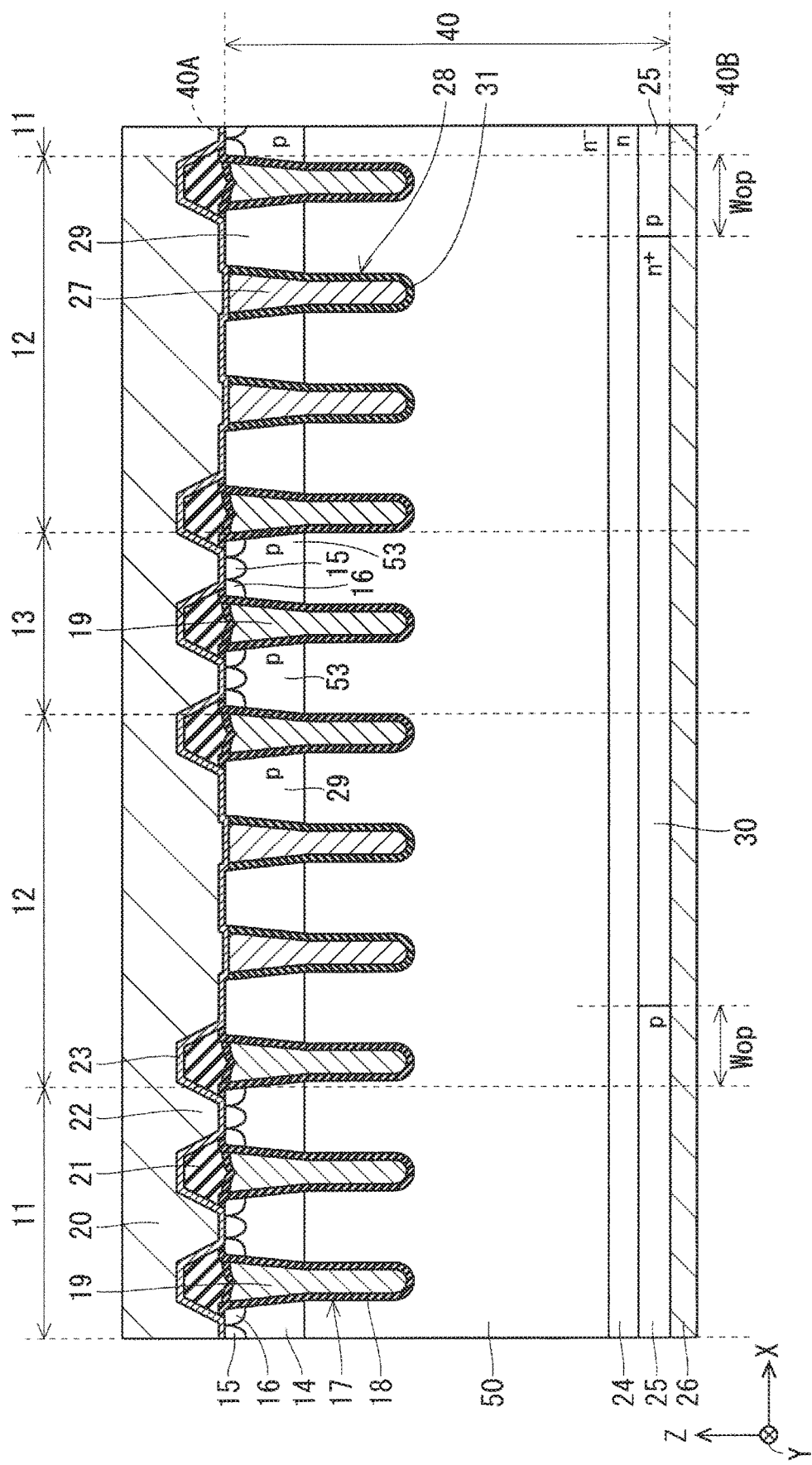
FIG. 8 is a cross-sectional view of a structure of a semiconductor device of a fifth preferred embodiment.

FIG. 8 is a cross-sectional view of a structure of a semiconductor device 10E according to the fifth preferred embodiment. As shown in FIG. 8, a heavily doped base layer 53 serving as the MOSFET base layer in the MOSFET region 13 is made higher in p-type impurity concentration than the base layer 14 in the IGBT region 11.

That is, in the semiconductor device 10E of the fifth preferred embodiment, the heavily doped base layer 53 serving as the MOSFET base layer is made higher in impurity concentration of p-type that is the second conductivity type than the base layer 14 serving as the IGBT base layer.

As a result, the MOSFET MOS gate structure in the MOSFET region 13 can be made higher in threshold voltage than the IGBT MOS gate structure in the IGBT region 11.

Therefore, in the semiconductor device 10E of the fifth preferred embodiment, the channel resistance of the channel region in the heavily doped base layer 53 can be increased owing to that the MOSFET MOS gate structure is made higher in threshold voltage than the IGBT MOS gate structure, thereby enabling the function as the built-in diode in the MOSFET region 13 even when a positive voltage is applied to the gate electrode 19.

On the other hand, when the threshold voltage of the MOSFET MOS gate structure is too high, it is difficult to perform the MOSFET operation. Therefore, setting a limit on the threshold voltage of the MOSFET MOS gate structure that is increased in a range of 0.05 V or more to less than 0.3 V relative to the threshold voltage of the IGBT MOS gate structure allows both the MOSFET operation and the built-in diode operation to be properly performed in the MOSFET region 13.

Note that, in the semiconductor device 10E of the fifth preferred embodiment, the MOSFET base layer is made higher in p-type impurity concentration than the IGBT base layer to make the MOSFET MOS gate structure higher in threshold voltage than the IGBT MOS gate structure, but other aspects are possible.

For example, the insulating film 18 in the MOSFET MOS gate structure can be made thicker than the insulating film 18 in the IGBT MOS gate structure to make the MOSFET MOS gate structure higher in threshold voltage than the IGBT MOS gate structure.

Note that the present invention can be implemented by any combination of the preferred embodiments within the scope of the present invention, and each of the preferred embodiments can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device including an IGBT region having an IGBT therein, a diode region having a diode therein, and a MOSFET region having a MOSFET therein, the semiconductor device comprising:
   a semiconductor substrate including first and second main surfaces;
   a drift layer of a first conductivity type provided in the semiconductor substrate;
   a base layer of a second conductivity type provided in the semiconductor substrate, the base layer being selectively disposed adjacent to the first main surface side relative to the drift layer; and
   an anode layer of the second conductivity type provided in the semiconductor substrate, the anode layer being selectively disposed adjacent to the first main surface side relative to the drift layer, wherein
   the drift layer is shared among the IGBT region, the diode region, and the MOSFET region, the base layer is shared between the IGBT region and the MOSFET region, and the anode layer is used in the diode region, the IGBT region and the MOSFET region each include a buried conductive layer buried in a region extending from the first main surface into the drift layer through the base layer with an insulating film interposed between the buried conductive layer and the base layer and the drift layer, the IGBT region and the MOSFET region each include a MOS gate structure where the buried conductive layer serves as a gate electrode, the insulating film serves as a gate insulating film, and the base layer serves as a channel region, and the diode region is disposed between the IGBT region and the MOSFET region to cause the IGBT region and the MOSFET region to be separated from each other without being adjacent to each other.

2. The semiconductor device according to claim 1, wherein the diode region includes a dummy buried conductive layer buried in a region extending into the drift layer through the base layer with an insulating film interposed between the dummy buried conductive layer and the base layer and the drift layer.

3. The semiconductor device according to claim 2, wherein
the drift layer includes:
an IGBT drift layer formed in the IGBT region; and
a MOSFET drift layer formed in the MOSFET region, and
at least part of the MOSFET drift layer includes a drift heavily doped region that is made higher in impurity concentration of the first conductivity type than the IGBT drift layer.

4. The semiconductor device according to claim 3, wherein the drift heavily doped region is provided all over the MOSFET drift layer.

5. The semiconductor device according to claim 3, wherein
the IGBT drift layer includes, in a region in contact with the base layer, a carrier store region that is higher in impurity concentration of the first conductivity type than other regions of the IGBT drift layer, and
the carrier store region and the drift heavily doped region are made identical to each other in both impurity concentration of the first conductivity type and formation depth.

6. The semiconductor device according to claim 2, wherein in the IGBT region, the drift layer includes, in a region in contact with the base layer, a carrier store region that is higher in impurity concentration of the first conductivity type than other regions of the drift layer.

7. The semiconductor device according to claim 2, wherein
the buried conductive layer includes:
at least one IGBT buried conductive layer formed in the IGBT region; and
at least one MOSFET buried conductive layer formed in the MOSFET region,
each of the at least one IGBT buried conductive layer is formed adjacent to and spaced apart from another IGBT buried conductive layer or the dummy buried conductive layer by an IGBT gap,
each of the at least one MOSFET buried conductive layer is formed adjacent to and spaced apart from another MOSFET buried conductive layer or the dummy buried conductive layer by a MOSFET gap, and
the MOSFET gap is made smaller than the IGBT gap.

8. The semiconductor device according to claim 2, wherein
the buried conductive layer includes an IGBT buried conductive layer formed in the IGBT region, and
the IGBT buried conductive layer includes a plurality of partial IGBT buried conductive layers that are electrically separated from each other.

9. The semiconductor device according to claim 8, wherein
the buried conductive layer further includes a MOSFET buried conductive layer formed in the MOSFET region,
the MOSFET buried conductive layer includes a plurality of partial MOSFET buried conductive layers that are electrically separated from each other, and
the dummy buried conductive layer includes a plurality of partial dummy buried conductive layers that are electrically separated from each other.

10. The semiconductor device according to claim 1, wherein
the IGBT region further includes a collector layer of the second conductivity type, the collector layer being located adjacent to the second main surface side relative to the drift layer,
the diode region further includes a cathode layer of the first conductivity type, the cathode layer being located adjacent to the second main surface side relative to the drift layer and provided in a formation layer where the collector layer is located, and
between the diode region and the IGBT region adjacent to each other, the collector layer extends into the diode region by a protruding distance relative to an interface between the diode region and the IGBT region.

11. The semiconductor device according to claim 1, wherein
the MOS gate structure includes:
an IGBT MOS gate structure formed in the IGBT region; and
a MOSFET MOS gate structure formed in the MOSFET region, and
the MOSFET MOS gate structure is made higher in threshold voltage than the IGBT MOS gate structure.

12. The semiconductor device according to claim 11, wherein
the base layer includes:
an IGBT base layer formed in the IGBT region; and
a MOSFET base layer formed in the MOSFET region, and
the MOSFET base layer is made higher in impurity concentration of the second conductivity type than the IGBT base layer.

* * * * *